US011587620B2

(12) United States Patent
Berman et al.

(10) Patent No.: US 11,587,620 B2
(45) Date of Patent: Feb. 21, 2023

(54) AUTOMATIC PROGRAM VOLTAGE SELECTION NETWORK

(71) Applicant: SAMSUNG ELECTRONICS CO., LTD., Suwon-si (KR)

(72) Inventors: Amit Berman, Ramat-Gan (IL); Evgeny Blaichman, Tel Aviv (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 102 days.

(21) Appl. No.: 16/893,866

(22) Filed: Jun. 5, 2020

(65) Prior Publication Data
US 2021/0383871 A1    Dec. 9, 2021

(51) Int. Cl.
| | |
|---|---|
| *G11C 16/04* | (2006.01) |
| *G11C 16/10* | (2006.01) |
| *G06N 3/08* | (2023.01) |
| *G11C 16/26* | (2006.01) |
| *G06N 3/04* | (2023.01) |

(52) U.S. Cl.
CPC ........... *G11C 16/10* (2013.01); *G06N 3/0481* (2013.01); *G06N 3/08* (2013.01); *G11C 16/0483* (2013.01); *G11C 16/26* (2013.01)

(58) Field of Classification Search
CPC ..... G11C 16/10; G11C 16/0483; G11C 16/26; G11C 11/54; G11C 16/30; G06N 3/0481; G06N 3/08; G06N 3/063
See application file for complete search history.

(56) References Cited

U.S. PATENT DOCUMENTS

| | | | |
|---|---|---|---|
| 2008/0002468 A1* | 1/2008 | Hemink | G11C 16/349 |
| | | | 714/E11.038 |
| 2009/0003058 A1* | 1/2009 | Kang | G11C 16/3454 |
| | | | 365/185.18 |
| 2020/0234772 A1* | 7/2020 | Halperin | G11C 16/08 |

* cited by examiner

*Primary Examiner* — Hien N Nguyen

(74) *Attorney, Agent, or Firm* — F. Chau & Associates, LLC

(57) ABSTRACT

A method, apparatus, non-transitory computer readable medium, and system for selecting program voltages for a memory device are described. Embodiments of the method, apparatus, non-transitory computer readable medium, and system may map a set of information bits to voltage levels of one or more memory cells based on a plurality of embedding parameters, program the set of information bits into the one or more memory cells based on the mapping, detect the voltage levels of the one or more memory cells to generate one or more detected voltage levels, and identify a set of predicted information bits based on the one or more detected voltage levels using a neural network comprising a plurality of network parameters, wherein the network parameters are trained together with the embedding parameters.

4 Claims, 12 Drawing Sheets

US 11,587,620 B2

AUTOMATIC PROGRAM VOLTAGE SELECTION NETWORK

BACKGROUND

The following relates generally to memory devices, and more specifically to selecting program voltages for a memory device.

Memory devices are commonly used electronic components for storing data. NAND flash memory devices allow several bits of data to be stored in each memory cell, providing improvements in manufacturing costs and performance. A memory cell in which multiple bits of data are stored may be referred to as a multi-level memory cell. A multi-level memory cell partitions a threshold voltage range of a memory cell into several voltage states, and data values written to the memory cell are extracted using the memory cell voltage levels.

The voltage levels used to program the memory cells may be determined manually based on theoretical considerations. However, manual selection of voltage levels does not provide optimal voltage levels for minimizing read errors. Therefore, there is a need in the art for improved systems for determining voltage levels for programming data to memory cells.

SUMMARY

A method, apparatus, non-transitory computer readable medium, and system for selecting program voltages for a memory device are described. Embodiments of the method, apparatus, non-transitory computer readable medium, and system may include programming a set of information bits into one or more memory cells using a neural network embedding based on a plurality of embedding parameters; determining a set of predicted information bits based on voltage levels of the memory cells using a neural network comprising a plurality of network parameters that are trained together with embedding parameters; and reading the information bits from the memory device based on the set of predicted information bits.

A method, apparatus, non-transitory computer readable medium, and system for selecting program voltages for a memory device are described. Embodiments of the method, apparatus, non-transitory computer readable medium, and system may initialize a plurality of embedding parameters and a set of network parameters, map a set of information bits to voltage levels of one or more memory cells based on the embedding parameters, identify a set of predicted information bits using an artificial neural network (ANN) based on the network parameters, and update the embedding parameters and the network parameters based at least in part on the set of predicted information bits.

An apparatus, system, and method for selecting program voltages for a memory device are described. Embodiments of the apparatus, system, and method may include a plurality of memory cells, a programming component comprising an embedding layer based on a plurality of embedding parameters, and a reading component comprising a neural network based on a plurality of network parameters, wherein the network parameters are trained together with the embedding parameter.

DETAILED DESCRIPTION

Figure 1:
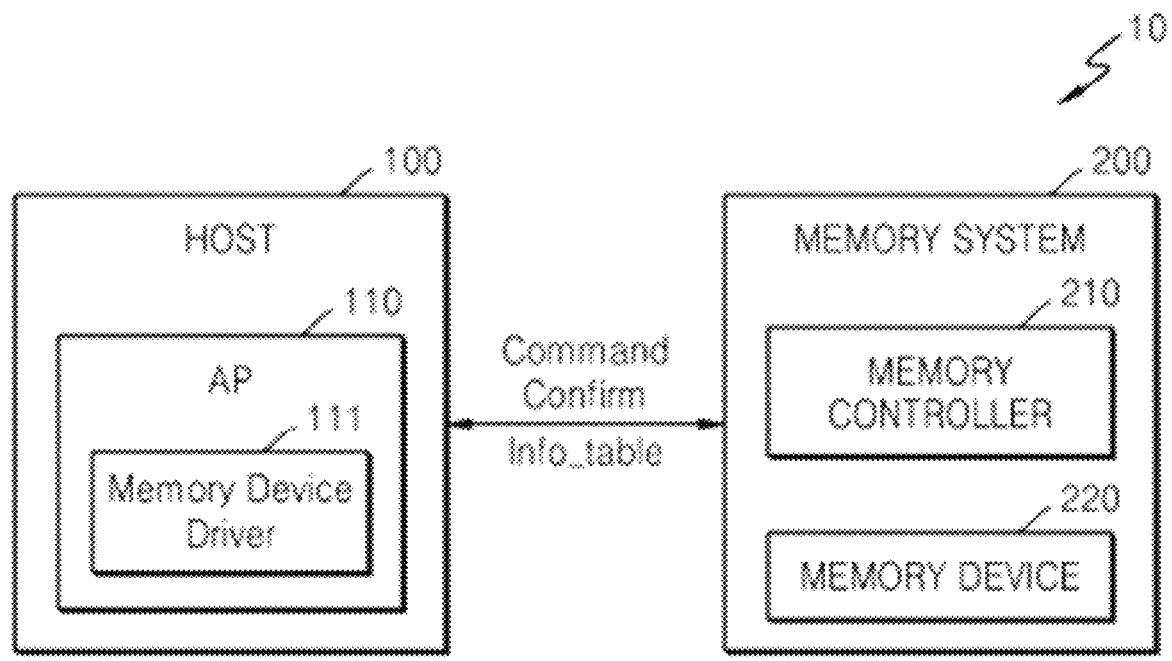
FIG. 1 shows an example of an implementation of a data processing system including a memory system according to aspects of the present disclosure.

The present disclosure relates to system and methods for programming and reading data from a memory device, and more specifically to selecting program voltages for a memory device. Certain embodiments of the disclosure specifically relate to NAND Flash memory devices capable of storing 5 or 6 bits of data in each memory cell.

Memory devices are commonly used electronic components for storing data. NAND flash memory devices allow several bits of data to be stored in each memory cell, providing improvements in manufacturing costs and performance. A memory cell in which multiple bits of data are stored may be referred to as a multi-level memory cell. A multi-level memory cell partitions a threshold voltage range of a memory cell into several voltage states, and data values written to the memory cell are extracted using the memory cell voltage levels.

To read the information from a memory device, voltage of each cell is measured and the voltage level that was stored in the cell is inferred. The bits can then be recovered. There may be a tradeoff between the number of voltage levels and the memory reliability. The larger the number of bits per cell, the more information that can be stored on the device, where there are more bits in every cell. Alternatively, the voltages that represent different levels may be packed more tightly together, because within the same dynamic range, a larger number of distinguishable voltages is used. As a result, noise in the cell programming or cell reading has a larger chance of changing the voltage of a level to another voltage representing a different level, therefore rendering an error upon reading the cell.

There are multiple sources of noise in a memory device that can result in erroneous reading of the information, such as writing noise, interference noise, aging, and operation of reading. Writing noise is the voltage of a cell immediately after programming it differs from the intended voltage due to a programming procedure. Interference noise is a function of the voltage of a cell changing as a result of programming a different neighboring cell. Programming cells causes a disturbance that affects other cells. Aging is where there is an increase in noise the more times a device is written and read from. Additionally, the more time between programing of a cell, the more noise the cell will produce. Also, the operation of reading a cell can cause noise and disturbances.

The memory device can be referred to as a channel. The term channel is used because a write and/or send operation can go to and/or through the channel. When the information is read, the information will be corrupted with noise, depending on the characteristics of the medium.

Memory programming is a complex process based on applying a voltage to a memory cell. However, cell voltage may be affected by variables such as current voltage level, pulse power, and inter cell interferences. Cell voltage may also be affected by inhibited cell disruption, inter word-line (WL) coupling, and cell retention. Additionally, the outcome of writing to a NAND device may be stochastic. For example, data may also be noisy, leading to problems with observation.

Conventional approaches for selecting programming voltages use manual optimization techniques such as trial-and-error. These manual processes do not provide optimal performance, and may not incorporate statistical data. Additionally, metrics of success, such as target voltages, are produced for specific applications and may not be applicable to multiple applications. Furthermore, the manual optimization may be resource intensive, and compromise on various metrics to enable other metrics to operate faster or more efficiently.

Therefore, systems and methods of the present disclosure may be used to find improved program voltages of a cell. Certain methods of finding program voltages of a cell use a learning-based memory system. The learning-based memory system includes a program network, a NAND memory (or NAND Channel), and a read network. The NAND memory may have multiple memory cells, each of which can be programmed using multiple different voltage levels.

Embodiments of the present disclosure may be used in a flash memory controller. Additionally, the present disclosure can outperform the current manual optimization process, in terms of Bit-Error-Rate, and has the merit of quick development compared to manual optimization processes.

The present disclosure describes a method of finding an optimized constellation for modulation, given the number of bits per cell N and the number of cells K. The method may be automatic, and data driven, using data from the real NAND channel and thus finds a constellation which is specifically well fitted for the channel. Embodiments of the present disclosure can find a constellation that yields a small number of errors upon reading, for a given number of bits per cell.

The present disclosure utilizes machine learning to find the constellation. The training process may be performed off-line, during the product development, not per each specific NAND chip instance. The training process results can then be applied to all instances of NAND chips with similar specifications.

The machine learning setting is composed of a program network module, a read network, and a NAND channel. The program network takes a level as input and returns the voltage sequence for the level. The program network is the mapping performed by the constellation. The program network enables continuous optimization of voltages. The read network predicts the original information based on detected voltage levels of the memory cells.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Exemplary Memory System

FIG. 1 is a block diagram illustrating an implementation of a data processing system including a memory system, according to an exemplary embodiment of the inventive concept.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, exemplary embodiments of the inventive concept will be described as including a memory device that is a non-volatile memory. However, exemplary embodiments are not limited thereto. For example, the memory system 200 may include a memory device that is a volatile memory.

According to exemplary embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

As described above, the host 100 may include an AP 110. The AP 110 may include various intellectual property (IP) blocks. For example, the AP 110 may include a memory device driver 111 that controls the memory system 200. The host 100 may communicate with the memory system 200 to transmit a command related to a memory operation and receive a confirm command in response to the transmitted command. The host 100 may also communicate with the memory system 200 with regard to an information table related to the memory operation.

The memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command, or may provide read data to the memory controller 210 in response to the internal command.

Figure 4:
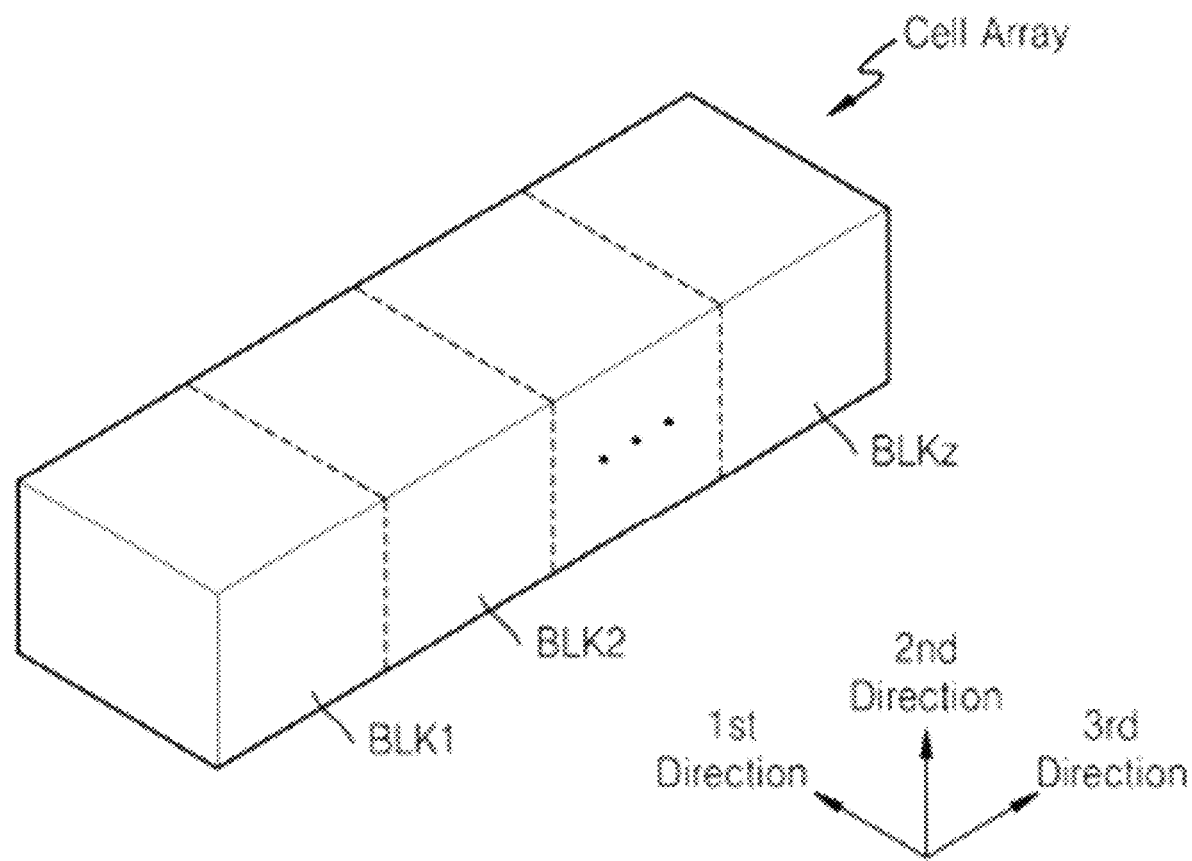
FIG. 4 shows an example of the memory cell array of FIG. 2 according to aspects of the present disclosure.

The memory device 220 includes a memory cell array that retains data stored therein, even when the memory device 220 is not powered on. The memory cell array may include as memory cells, for example, a NAND or NOR flash memory, a magneto-resistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
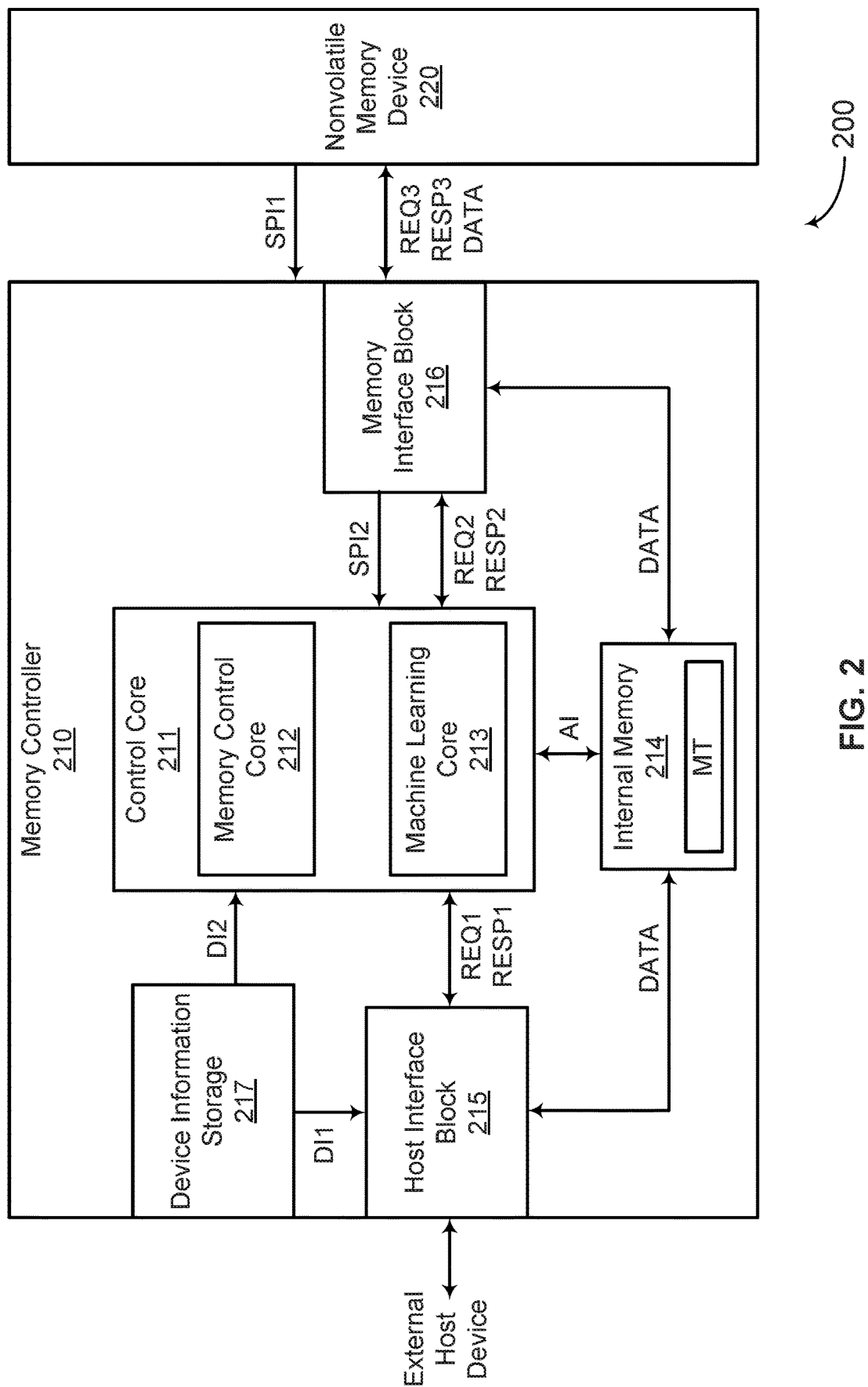
FIG. 2 shows an example of the memory system of FIG. 1 according to aspects of the present disclosure.

FIG. 2 is a block diagram illustrating the memory system 200 of FIG. 1, according to an exemplary embodiment of the inventive concept.

Referring to FIG. 2, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 211, an internal memory 214, a host interface block 215, and a memory interface block 216. The memory controller 210 may also include a device information storage 217 configured provide first device information DI' to the host interface block 215 and second device information DI2 to the controller core 211.

The controller core 211 may include a memory control core 212 and a machine learning core 213, and each of these cores may be implemented by one or more processors. The memory control core 212 may control and access the memory device 220 depending on a request received from the host 100 or an internally designated schedule. The memory control core 212 may manage and execute various metadata and codes used to manage or operate the memory system 200.

The machine learning core 213 may be used to perform training and inference of a neural network that is designed to perform noise cancellation on the memory device 220, as described in further detail below.

The internal memory 214 may be used, for example, as a system memory which is used by the controller core 211, a cache memory which stores data of the memory device 220, or a buffer memory which temporarily stores data between the host 100 and the memory device 220. The internal memory 214 may store a mapping table MT that indicates a relationship between logical addresses assigned to the memory system 200 and physical addresses of the memory device 220. The internal memory 214 may include, for example, a DRAM or an SRAM.

In an exemplary embodiment, a neural network such as the neural network described with reference to FIG. 9, may be included in a computer program which is stored in the internal memory 214 of the memory controller 210 or in the memory device 220. The computer program including the neural network may be executed by the machine learning core 213 to denoise data stored in the memory device 220. Thus, according to exemplary embodiments, the memory system 200 may denoise the data stored in the memory device 220 during a normal read operation of the memory device 220. That is, after manufacture of the memory system 200 is complete, during normal operation of the memory system 200, and particularly, during a normal read operation of the memory system 200 in which data is read from the memory device 220, the data stored in the memory device 220 that is being read may be denoised using the neural network locally stored and executed in the memory system 200, and the denoised data may be read out from the memory device 220.

The host interface block 215 may include a component for communicating with the host 100 such as, for example, a physical block. The memory interface block 216 may include a component for communicating with the memory device 220 such as, for example, a physical block.

Below, an operation of the memory system 200 over time will be described. When power is supplied to the memory system 200, the memory system 200 may perform initialization with the host 100.

The host interface block 215 may provide the memory control core 212 with a first request REQ1 received from the host 100. The first request REQ1 may include a command (e.g., a read command or a write command) and a logical address. The memory control core 212 may translate the first request REQ1 to a second request REQ2 suitable for the memory device 220.

For example, the memory control core 212 may translate a format of the command. The memory control core 212 may obtain address information AI with reference to the mapping table MT stored in the internal memory 214. The memory control core 212 may translate a logical address to a physical address of the memory device 220 by using the address information AI. The memory control core 212 may provide the second request REQ2 suitable for the memory device 220 to the memory interface block 216.

The memory interface block 216 may register the second request REQ2 from the memory control core 212 at a queue. The memory interface block 216 may transmit a request that is first registered at the queue to the memory device 220 as a third request REQ3.

When the first request REQ1 is a write request, the host interface block 215 may write data received from the host 100 to the internal memory 214. When the third request REQ3 is a write request, the memory interface block 216 may transmit data stored in the internal memory 214 to the memory device 220.

When data is completely written, the memory device 220 may transmit a third response RESP3 to the memory interface block 216. In response to the third response RESP3, the memory interface block 216 may provide the memory control core 212 with a second response RESP2 indicating that the data is completely written.

After the data is stored in the internal memory 214 or after the second response RESP2 is received, the memory control core 212 may transmit a first response RESP1 indicating that the request is completed to the host 100 through the host interface block 215.

When the first request REQ1 is a read request, the read request may be transmitted to the memory device 220 through the second request REQ2 and the third request REQ3. The memory interface block 216 may store data received from the memory device 220 in the internal memory 214. When data is completely transmitted, the memory device 220 may transmit the third response RESP3 to the memory interface block 216.

As the third response RESP3 is received, the memory interface block 216 may provide the memory control core 212 with the second response RESP2 indicating that the data is completely stored. As the second response RESP2 is received, the memory control core 212 may transmit the first response RESP1 to the host 100 through the host interface block 215.

The host interface block 215 may transmit data stored in the internal memory 214 to the host 100. In an exemplary embodiment, in the case in which data corresponding to the first request REQ1 is stored in the internal memory 214, the transmission of the second request REQ2 and the third request REQ3 may be omitted.

The memory device 220 may also transmit first Serial Peripheral Interface information SPI1 to the memory interface block 216. The memory interface block 216 may transmit second Serial Peripheral Interface information SPI2 to the controller core 211.

Figure 3:
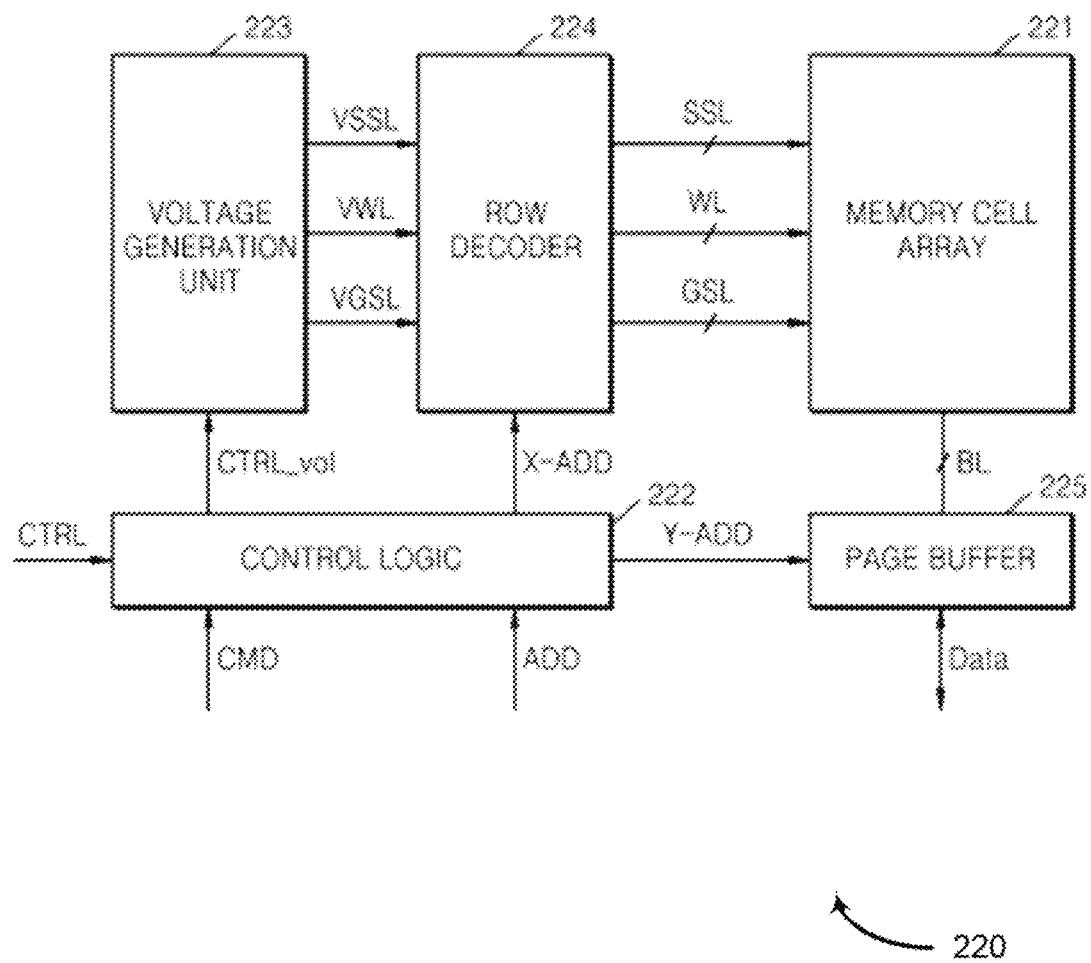
FIG. 3 shows an example of the non-volatile memory device of FIG. 1 according to aspects of the present disclosure.

FIG. 3 is a detailed block diagram of the non-volatile memory device 220 of FIG. 1, according to an exemplary embodiment of the inventive concept. Referring to FIG. 3, the memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an exemplary embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 5:
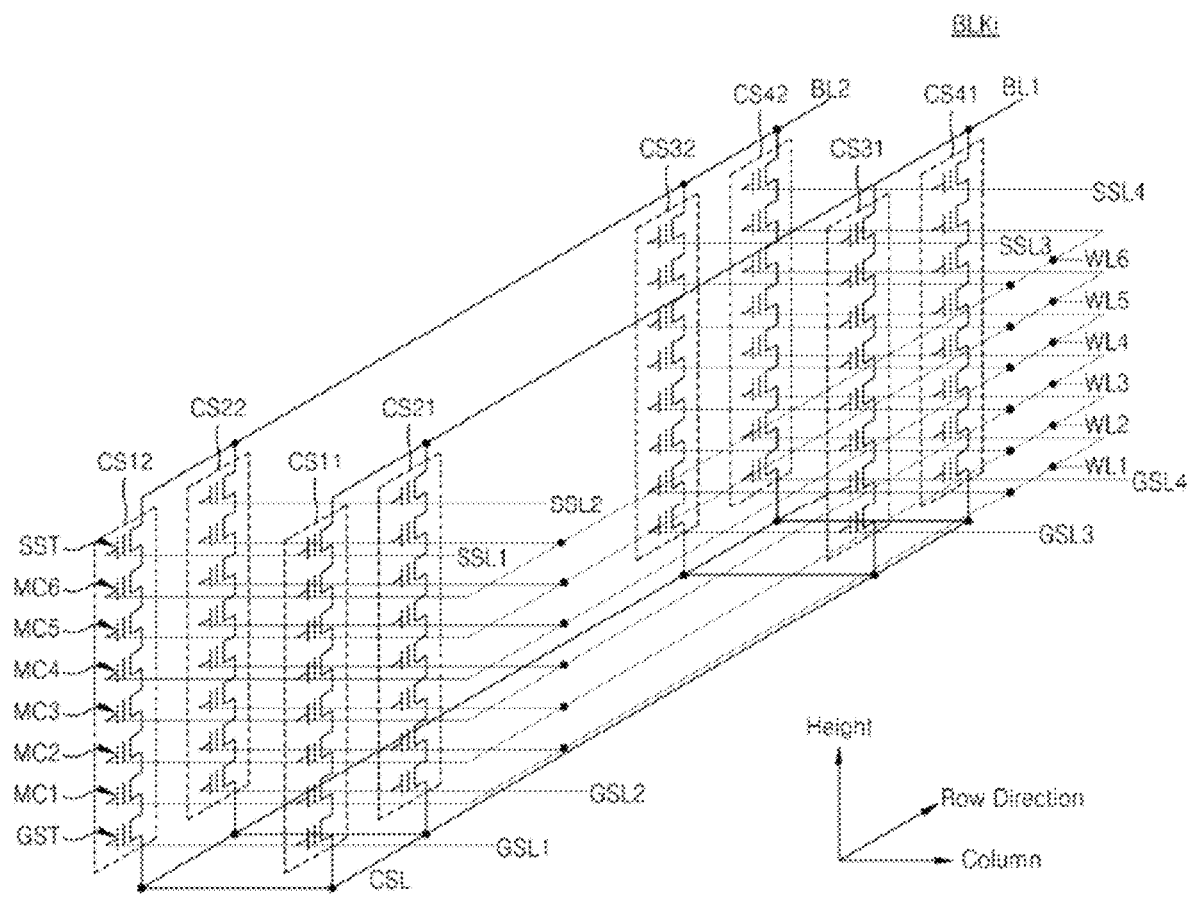
FIG. 5 shows an example of a memory block of the memory cell array of FIG. 4 according to aspects of the present disclosure.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an exemplary embodiment of the inventive concept.

Referring to FIG. 4, the memory cell array 221 according to an exemplary embodiment includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an exemplary embodiment of the inventive concept. FIG. 5 illustrates an example of one of the memory blocks BLK1 to BLKz in the memory cell array 221 of FIG. 4. The number of cells and wordlines depicted in FIG. 5 is only an example, and any suitable number of memory cells and wordlines may be used.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

Modulation

Figure 6:
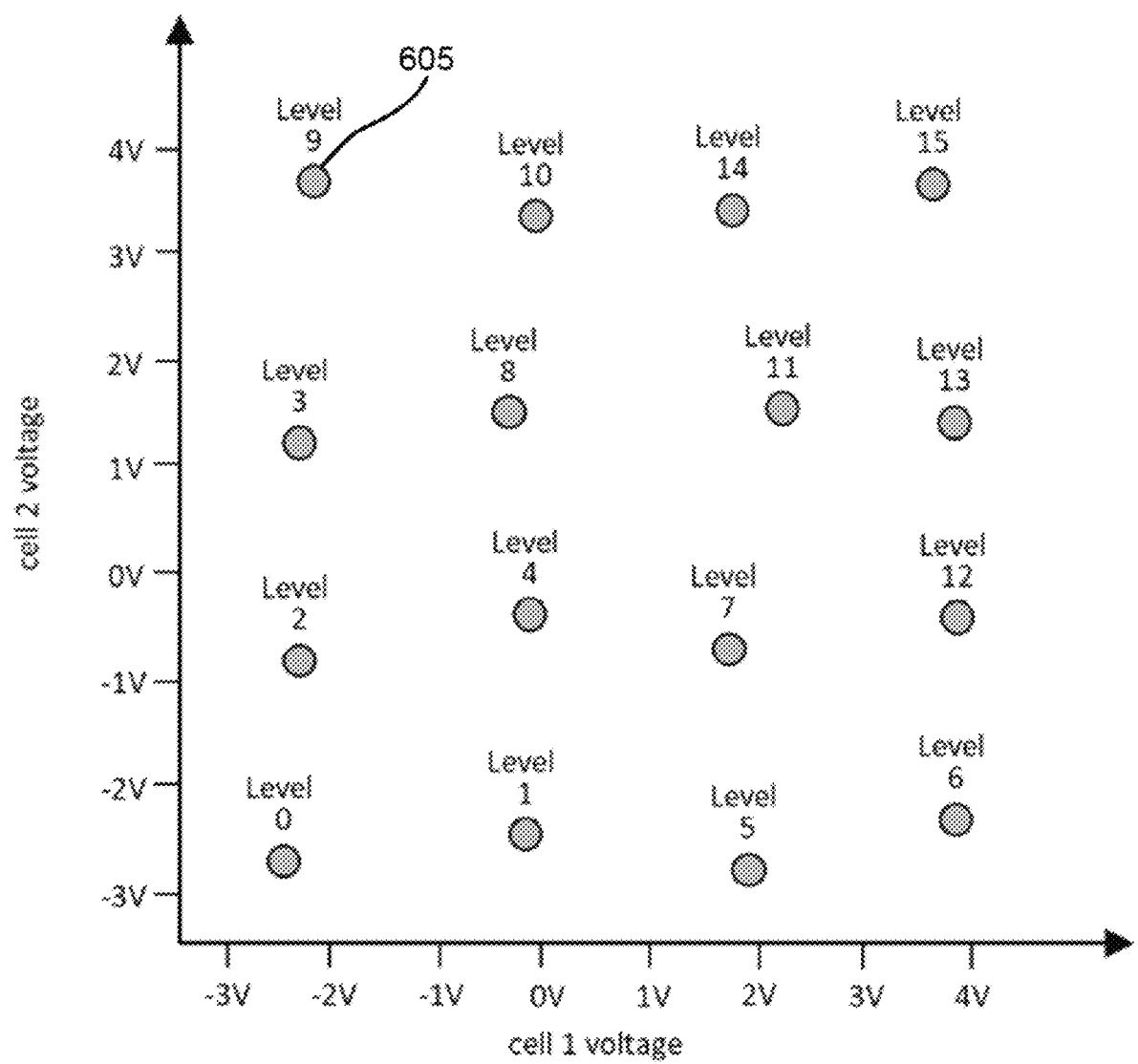
FIG. 6 shows an example of a voltage level constellation according to aspects of the present disclosure.

FIG. 6 shows an example of a voltage level constellation 600 according to aspects of the present disclosure. Voltage level constellation 600 represents an example of a modulation scheme that may be used for programming data to a memory device according to embodiments of the present disclosure. The modulation scheme may involve grouping memory cells into groups of a given number (denoted by K) and dividing the voltage levels of each cell into a discrete levels (denoted by N).

Voltage level constellation 600 includes two cells with two bits per cell (bpc), i.e., N=2 bpc and K=2 cells. However, in other examples, a different number of cells and bpc may be used. Each cell is represented as one axis, and each information symbol 605 is represented by a pair of voltage levels (one for each cell). The number of cells determines the number of axes, and the bpc determines the number of potential voltage levels.

For example, if the bpc=N, the number of voltage levels per cell can be $2^N$. Thus, here there are two axes with 4 levels each, such that the voltage level constellation 600 includes 16 information symbols 605. Note that the positions of the information symbols 605 are not perfectly aligned. That is, the voltage levels may not be evenly spaced, and they may not be the same for each of the cells.

Thus, modulation may be used for writing information to a NAND device. In short, rather than writing N bits per cell, modulation writes N*K bits per K cells. To store a stream of bits to the NAND, the stream of information is grouped into groups of size (N*K) bits. Each group may have $2^{N*K}$ different combinations of values. Therefore, a mapping from each group to a number L in the range [0, $(2^{N*K}-1)$] is performed.

To each non-interlapping set of K cells, a single level is written. Each level is associated with a unique sequence of K voltages, such as V1(L), V2(L), ..., VK(L), by a fixed, predetermined mappings. Therefore, to store the level L in the K cells, the first cell to the voltage V1(L), the second cell to the voltage V2(L) and so on are jointly programmed.

If the constellation is calculated correctly, the modulation increases reliability (error rate). This is true when there is interference noise between cells that are jointly programmed. In the field of telecommunication, modulation is widely used for similar reasons. A suitable modulation scheme may be chosen based on the physical channel and communication needs.

Modulation may provide for storing non-integer numbers of bits per cell. For example, we can store 3½ bits per cell by storing 7 bits in 2 cells. In other words, if we have 128 levels ($128=2^7$) and we write them over 2 cells, then in terms of bits per cell this is equivalent to 3½ bits per cell.

In another example, a non-integer number of bits per cell may be used with the restriction that $2^{(N*K)}$ is integer, even if N*K is not an integer. For example, a device may be based on K=3 cells, and $2^{(N*K)}=30000$. In this case, there may be a challenge detecting the set of information bits because the number of bits is N*K which may not an integer. That is, N*K=log 2(30000)≅14.9. Therefore, this case (where N*K is not an integer) may be limited to circumstances where two conditions hold. Namely, 1) the number of information bits is obtained by rounding N*K up to the nearest integer (i.e., 15 in this example), and 2) some combinations of information bits are not allowed in the input and output. This means that there may be fewer than $2^{15}$ options for the input. For example, the number of allowed combinations could be at most 30000.

According to various embodiments, program voltage selection of a cell may be performed by a pulse amplitude modulation (PAM) modulation algorithm where coded bits are divided to groups of a number of bits per cell. For example, in triple level cells (TLC), the number of bits per cell is 3. Each group of cells is called a symbol. For example, a symbol with bits 010 is equal to 2. The Vth dynamic range is divided to $2^N$ bits per cell. For N-bits per cell is equal to 3Vth dynamic range is divided to 8 target voltages. Each target voltage is mapped to a symbol using Gray code, where only a single bit change between adjacent target voltages. For example, if the dynamic range is between −3V and 4V, a modulation of −3V is 111, −2V is 110, −1V is 100, 0V is 101, 1V is 001, 2V is 000, 3V is 010, and 4V is 011 may be used.

The example modulation corresponds to an Additive white Gaussian noise (AWGN) channel. However, in many cases the NAND channel and AWGN channels are not the same, and the PAM modulation is not necessarily optimal for the NAND channel. Alternatively, a heuristic optimization can be done to find target voltages with increased performance.

Learning-Based Memory

Figure 7:
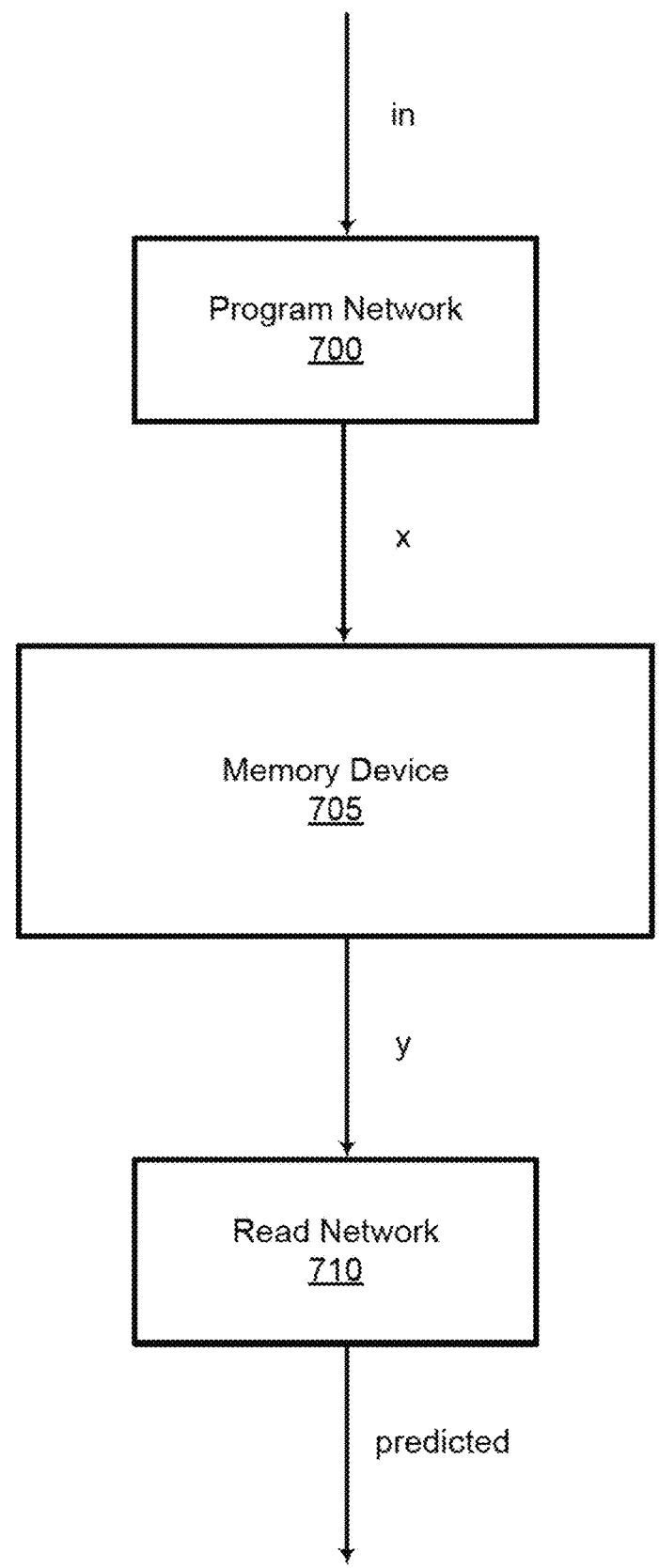
FIG. 7 shows an example of a learning-based memory system according to aspects of the present disclosure.

FIG. 7 shows an example of a learning-based memory system according to aspects of the present disclosure. The example shown includes program network 700, memory device 705, and read network 710.

In some examples, program network 700 and read network 710 may comprise an artificial neural network (ANN). An ANN may be a hardware or a software component that includes a number of connected nodes (a.k.a., artificial neurons), which may loosely correspond to the neurons in a human brain. Each connection, or edge, may transmit a signal from one node to another (like the physical synapses in a brain). When a node receives a signal, it can process the signal and then transmit the processed signal to other connected nodes. In some cases, the signals between nodes comprise real numbers, and the output of each node may be computed by a function of the sum of its inputs. Each node and edge may be associated with one or more node weights that determine how the signal is processed and transmitted.

It should be noted that this description of an ANN is more figurative than literal. In other words, it describes one way to interpret an ANN, but not necessarily how it is implemented. In a hardware or software implementation of an ANN, transmitting and receiving signals may not be performed literally.

During the training process, these weights may be adjusted to improve the accuracy of the result (i.e., by minimizing a loss function which corresponds in some way to the difference between the current result and the target result). The weight of an edge may increase or decrease the strength of the signal transmitted between nodes. In some cases, nodes may have a threshold below which a signal is not transmitted at all. The nodes may also be aggregated into layers. Different layers may perform different transformations on their inputs. The initial layer may be known as the input layer and the last layer may be known as the output layer. In some cases, signals may traverse certain layers multiple times.

Program network 700 maps a set of information bits to voltage levels of one or more memory cells based on a set of embedding parameters. Program network 700 may program the set of information bits into the one or more memory cells based on a mapping. Program network 700 may also apply a Gray code to the set of information bits, where the mapping is based on the Gray code. In some examples, there may be multiple memory cells, and the set of embedding parameters includes an array having a number of dimensions equal to a number of the memory cells. The number of dimensions may be different from the number of elements in the array. For example, the number of elements in the array may equal the number possible level (i.e., $2^{(N*K)}$), and each element of the array may be a K dimensional vector.

Prior to training, program network 700 and read network 710 may initialize a set of embedding parameters and a set of network parameters. Program network 700 may comprise a programming component including an embedding layer based on a set of embedding parameters. In some examples, the programming component further includes a sigmoid layer and a scaling layer. Program network 700 may be an example of, or include aspects of, the corresponding element or elements described with reference to FIG. 8.

The program network 700 maps input symbols as "in", taken from a finite discrete set, k. For example, the input to the program network may be a single symbol which can take any values from the set 0, ..., $2^{(N*K)}-1$, where the input includes N*K bits.

Additionally, the program network 700 the program network may convert the input symbol to program voltages, x1, ..., xK. The channel adds unknown noise n such that y=x+n. The read network 710 retrieves the input symbols "in_predicted". The read network's output may include more than just a prediction for the input symbol. For example, the output may include a score (or probability) for each possible input symbol. The symbol with the highest score can be taken as the prediction, but all of the scores may be used when calculate the loss function (e.g., the cross entropy) is calculated.

In some examples, the program network 700 and read network 710 may be trained together. For example, they may be trained by minimizing the cross-entropy between "in" and "in_predicted," or using some other suitable loss function.

An example program network 700 may contain an embedding layer. The input may be a single symbol from a set of $2^{(N*K)}$ possibilities. That is, the input can be N*K bits, and the output may be a sequence of K voltages.

Additionally, the program network 700 may contain a sigmoid layer and a scaling layer for scaling to the dynamic range of the memory cells. Thus, the program network 700 finds the program voltages of a cell.

Memory device 705 may comprise a set of memory cells as described with reference to FIGS. 1-5. In some examples, the set of memory cells include NAND memory cells. A memory cell can be set to a specified voltage, within a range called the dynamic range. The terms writing and programming may be used to describe the process of setting a cell to a desired voltage.

An example procedure of storing information on a NAND device is followed. Given a stream of bits (b1, b2, b3, b4, b5, b6, b7, b8, b9, b10 ... ) the bits are grouped into groups of N. For example, if N=4, the groups are represented as (b1, b2, b3, b4), (b5, b6, b7, b8), (b9, b10, b11, b12), etc., where N is the number of bits per cell. There are $2^N$ different combinations of values for each group of N bits. Therefore, a mapping from each group to an integer number L in the range [0, ($2^N$−1)] is performed. The number L is the level. A single level is written to each memory cell. Each level is associated with a unique voltage V(L) by a fixed, predetermined mapping. This type of mapping is called a constellation, where a constellation is representation of mapping from levels to voltages. Therefore, to store the level L in the cell, the voltage V(L) is programed to that cell.

To read the information from a memory device 705, voltage of each cell is measured and the voltage level that was stored in the cell is inferred. The bits can then be recovered. In some cases, there is a tradeoff between the N value and the memory reliability. The larger the N value, the more information that can be stored on the device, where there are more bits in every cell. Alternatively, the voltages that represent different levels may be packed more tightly together, because within the same dynamic range, a larger number of distinguishable voltages is used. As a result, noise in the cell programming or cell reading has a larger chance of changing the voltage of a level to another voltage representing a different level, therefore rendering an error upon reading the cell.

There are multiple sources of noise in the memory device 705 that can result in erroneous reading of the information, such as writing noise, interference noise, aging, and operation of reading. Writing noise is the voltage of a cell immediately after programming it differs from the intended voltage due to a programming procedure. Interference noise is a function of the voltage of a cell changing as a result of programming a different neighboring cell. Programming cells causes a disturbance that affects other cells. Aging is where there is an increase in noise the more times a memory device 705 is written and read from. Additionally, the more time between programing of a cell, the more noise the cell will produce. Also, the operation of reading a cell can cause noise and disturbances.

The memory device 705 can be referred to as a channel. The term channel is used because a write and/or send operation can go to and/or through the channel. When the information is read, the information will be corrupted with noise, depending on the characteristics of the medium.

Read network 710 detects the voltage levels of the one or more memory cells to generate one or more detected voltage levels. Read network 710 may then identify a set of predicted information bits based on the one or more detected voltage levels using a neural network including a set of network parameters. In some cases, the network parameters are trained together with the embedding parameters.

According to one embodiment, read network 710 may generate a set of information bit probabilities based on the detected voltage levels using the neural network. Read network 710 may then select a highest information bit probability from the set of information bit probabilities. In some cases, the set of predicted information bits is identified based on the highest information bit probability.

Read network 710 may identify a set of predicted information bits using an ANN based on network parameters. Read network 710 may comprise a reading component including a neural network based on a set of network parameters. In some cases, the network parameters are trained together with the embedding parameter. In some examples, the neural network includes a probability-based classifier. Read network 710 may be an example of, or include aspects of, the corresponding element or elements described with reference to FIG. 9.

Figure 8:
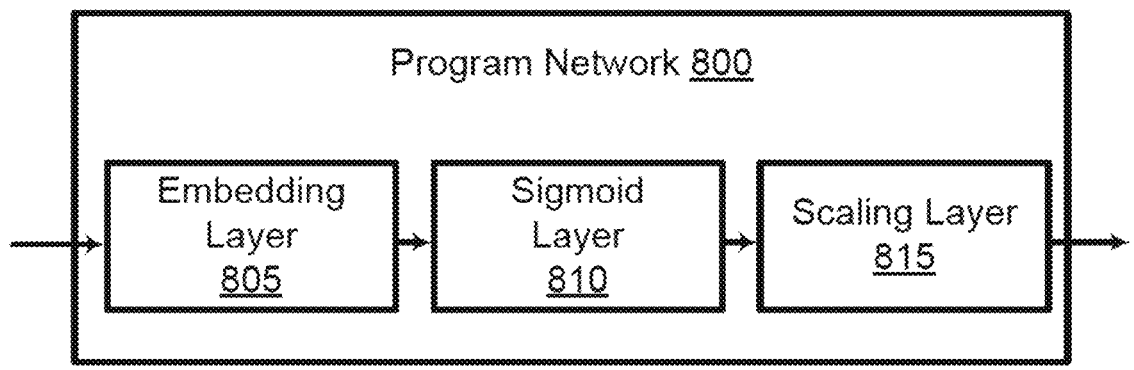
FIG. 8 shows an example of a program network according to aspects of the present disclosure.

FIG. 8 shows an example of a program network 800 according to aspects of the present disclosure. Program network 800 may be an example of, or include aspects of, the corresponding element or elements described with reference to FIG. 7. Program network 800 may include embedding layer 805, sigmoid layer 810, and scaling layer 815.

Embedding layer 805 embeds a set of information bits into an embedding space based on the embedding parameters to produce an embedded symbol. Sigmoid layer 810 applies a sigmoid function to constrain the embedded information symbol to produce a constrained symbol. Scaling layer 815 scales the constrained symbol to produce a scaled symbol corresponding to a voltage within a valid dynamic range. In some cases, the set of information bits is mapped based on the scaled symbol.

Figure 9:
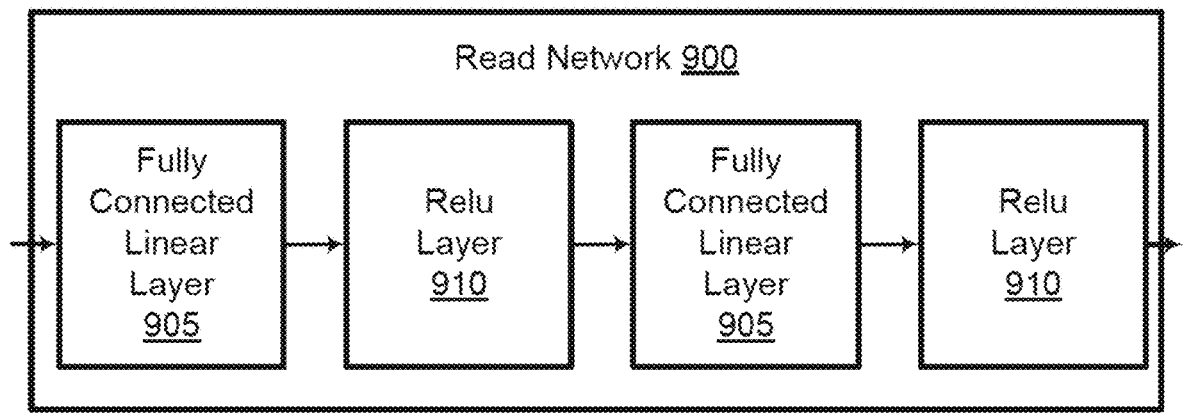
FIG. 9 shows an example of a read network according to aspects of the present disclosure.

FIG. 9 shows an example of a read network 900 according to aspects of the present disclosure. Read network 900 may be an example of, or include aspects of, the corresponding element or elements described with reference to FIG. 7. As shown, read network 900 may be a neural network that includes one or more fully connected layers 905 and one or more rectified linear unit (ReLU) layers 910. In some examples, fully connected layers 905 and ReLU layers 910 alternate as indicated in FIG. 9. However, this arrangement is used as an example, and any suitable neural network may be used that is capable of learning to associated detected voltage levels with information bits.

In some cases, one or more batch normalization may be used during training of the neural network. In some cases, networks incorporating batch normalization can use a higher learning rate without vanishing or exploding gradients. Furthermore, batch normalization may regularizes a network so that it is easier to generalize. Thus, in some cases, it may be unnecessary to use dropout to mitigate overfitting. The network may also become more robust to different initialization schemes and learning rates. Batch normalization may be achieved by fixing the mean and variance of each layer's inputs. In some cases, the normalization may be conducted over an entire training set. In other cases, normalization is restrained to each mini-batch in the training process.

In a neural network, an activation function may be used to transforming summed weighted inputs from a node into the activation of the node or an output. A ReLU layer may implement a rectified linear activation function, which comprises a piecewise linear function that outputs the input directly if is positive, otherwise, it outputs zero. A rectified linear activation function may be used as a default activation function for many types of neural networks.

Using a rectified linear activation function may enable the use of stochastic gradient descent with backpropagation of errors to train deep neural networks. The rectified linear activation function may operate similar to a linear function, but it may enable complex relationships in the data to be learned. The rectified linear activation function may also provide more sensitivity to the activation sum input to avoid saturation. A node or unit that implements a rectified linear activation function may be referred to as a rectified linear activation unit, or ReLU for short. Networks that use a rectifier function for hidden layers may be referred to as rectified networks.

Operation

Figure 10:
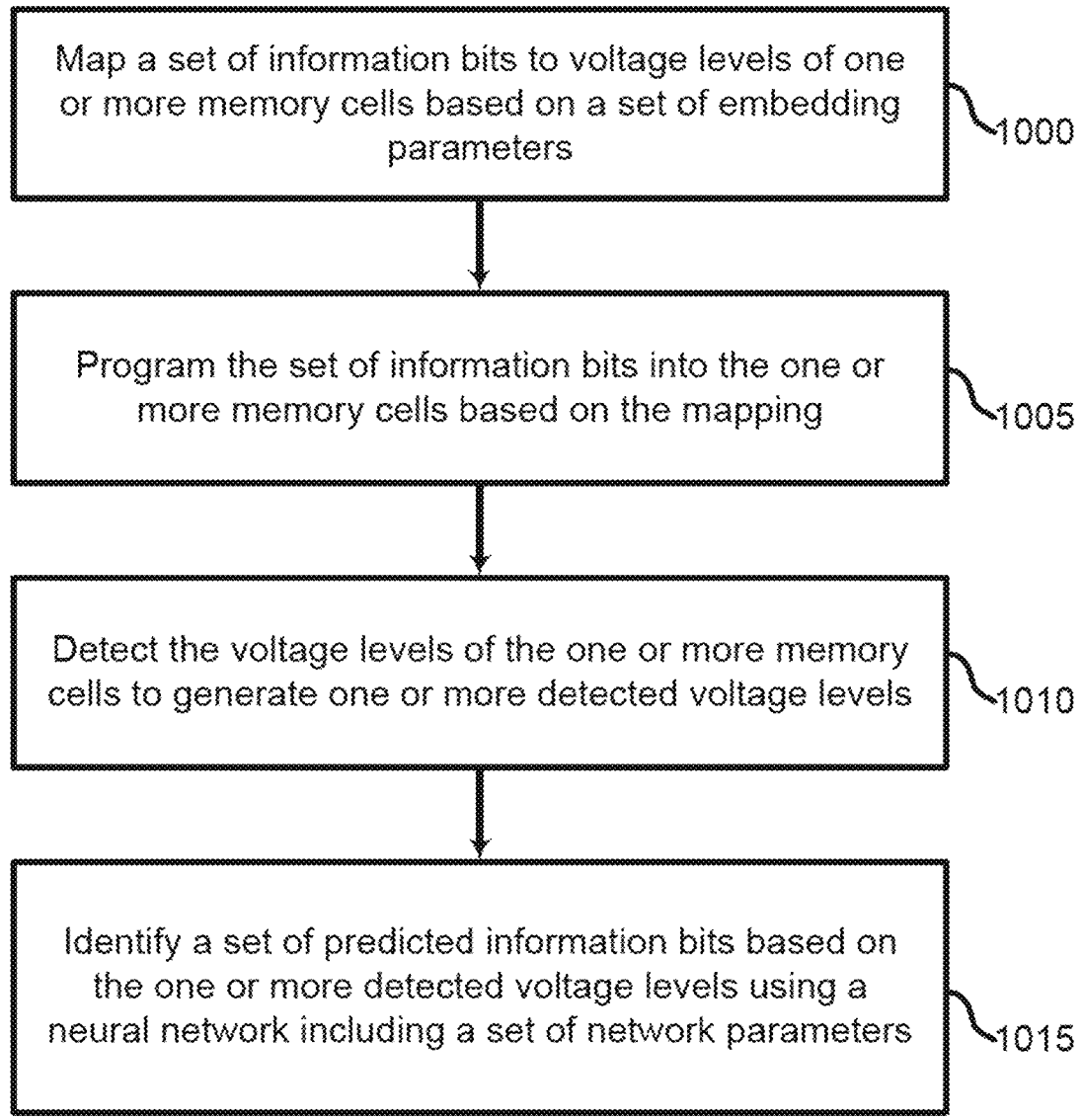
FIG. 10 shows an example of a process for operating a memory device according to aspects of the present disclosure.

FIG. 10 shows an example of a process for operating a memory device according to aspects of the present disclosure. According to various embodiments, the memory device may include an ANN, and operating the memory device may include finding an output of the ANN based on voltage levels read from the memory device.

In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At operation 1000, the system maps a set of information bits to voltage levels of one or more memory cells based on a set of embedding parameters. In some cases, the operations of this step may refer to, or be performed by, a program network as described with reference to FIGS. 7 and 8. In some cases, the information bits may be mapped based on a modulation scheme utilizing a voltage level constellation described with reference FIG. 6. For example, the program network parameters may include voltage levels for each of a plurality of cells corresponding to each symbol in a constellation. Further detail regarding the process for mapping information bits is described with reference to FIG. 11.

At operation 1005, the system programs the set of information bits into the one or more memory cells based on the mapping. In some cases, the operations of this step may refer to, or be performed by, a program network as described with reference to FIGS. 7 and 8.

In particular, the program network may include an embedding layer $2^{N*K} \rightarrow K$, which may include a table that maps an integer number in the range $[0, (2^{N*K}-1)]$ to a sequence of real numbers of length K. All entries into the table are treated as independent variables that can be optimized.

The output of an embedding layer may be passed through a sigmoid function, which is a continuous differentiable, monotonic function that takes an input and converts the input to a number in the range [0,1]. Each element of the sequence of length K is passed through the sigmoid. The result of this function is then rescaled to a range [VMIN, VMAX], where VMIN and VMAX are the minimal and maximal allowed voltages (i.e. the dynamic range). The rescaling is done using the function x→x*(VMAX−VMIN)+VMIN. The sigmoid and rescaling ensures that the output of the program network is within a valid range.

At operation 1010, the system detects the voltage levels of the one or more memory cells to generate one or more detected voltage levels. In some cases, the operations of this step may refer to, or be performed by, a read network as described with reference to FIGS. 7 and 9.

At operation 1015, the system identifies a set of predicted information bits based on the one or more detected voltage levels using a neural network including a set of network parameters, where the network parameters are trained together with the embedding parameters. In some cases, the operations of this step may refer to, or be performed by, a read network as described with reference to FIGS. 7 and 9. For example, a read network may identify a predicted constellation symbol and identify a set of information bits associated with the constellation symbol.

The read network may be a neural network classifier that takes as input a sequence of K voltages read from K cells from the memory device, and returns a prediction of which level was written to these K cells. The read network can be any neural network or any differentiable model. The number of outputs of the read network is $2^{N*K}$, where each of the $2^{N*K}$ numbers represents a score given by the read network to the corresponding level. For example, the score can represent the probability to be in the corresponding level. The channel can be either a real memory channel or a model of the memory channel.

Figure 11:
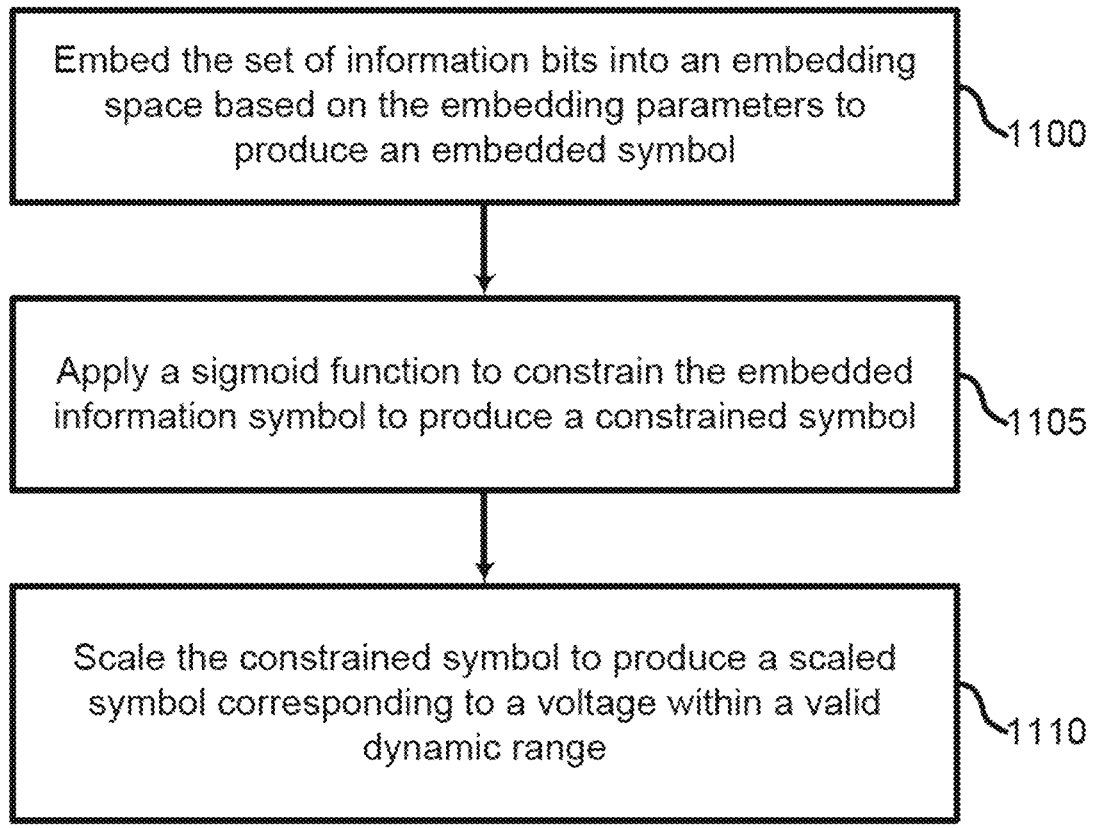
FIG. 11 shows an example of a process for programming information to a memory device according to aspects of the present disclosure.

FIG. 11 shows an example of a process for programming information to a memory device according to aspects of the present disclosure. In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At operation 1100, the system embeds the set of information bits into an embedding space based on the embedding parameters to produce an embedded symbol. In some cases, the operations of this step may refer to, or be performed by, an embedding layer as described with reference to FIG. 8.

At operation 1105, the system applies a sigmoid function to constrain the embedded information symbol to produce a constrained symbol. In some cases, the operations of this step may refer to, or be performed by, a sigmoid layer as described with reference to FIG. 8.

At operation 1110, the system scales the constrained symbol to produce a scaled symbol corresponding to a voltage within a valid dynamic range, where the set of information bits is mapped based on the scaled symbol. In some cases, the operations of this step may refer to, or be performed by, a scaling layer as described with reference to FIG. 8.

Training

Figure 12:
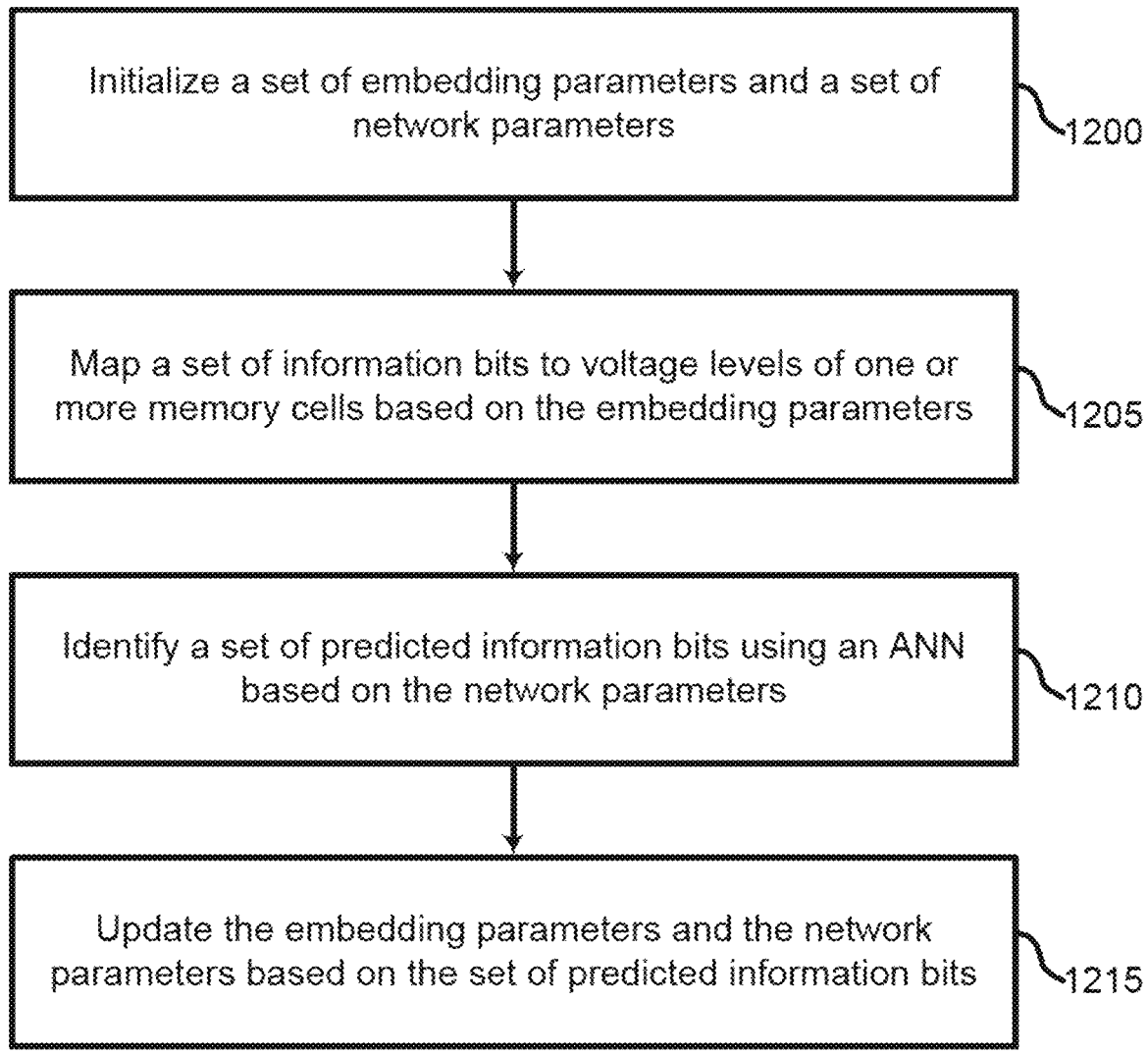
FIG. 12 shows an example of a process for training an ANN for selecting program voltages for a memory device according to aspects of the present disclosure.

FIG. 12 shows an example of a process for training an ANN for selecting program voltages for a memory device according to aspects of the present disclosure. In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At operation 1200, the system initializes a set of embedding parameters and a set of network parameters. In some cases, the operations of this step may refer to, or be performed by, a program network as described with reference to FIGS. 7 and 8. In some examples, the training procedure randomly initializes the parameters of the program network (i.e. the values in the embedding layer). Then, the training procedure randomly initialize the parameters (weights and biases) of the read network.

At operation 1205, the system maps a set of information bits to voltage levels of one or more memory cells based on the embedding parameters. For example, the mapping may be based on a programming constellation as described above with reference to FIG. 6. In some cases, the operations of this step may refer to, or be performed by, a program network as described with reference to FIGS. 7 and 8.

At operation 1210, the system identifies a set of predicted information bits using the ANN based on the network parameters. In some cases, the operations of this step may refer to, or be performed by, a read network as described with reference to FIGS. 7 and 9.

At operation 1215, the system updates the embedding parameters and the network parameters based at least in part on the set of predicted information bits. For example, the parameters may be updated based on the ANN's output, which may include additional information besides the predicted information. Specifically, the output of the ANN may include a score for various combinations of information bits. In some cases, the operations of this step may refer to, or be performed by, a training component.

The process of generating output using the ANN and then updating the parameters of the ANN may be repeated multiple times before the training process is complete. For example, the training process may continue until a threshold accuracy is achieved, a pre-determined number of training iterations have been performed, or until the network parameters converge.

According to one embodiment, updating the network parameters may be done according to the following algorithm. For each iteration of the algorithm of the present disclosure, the program and read network are optimized, minimizing cross entropy. Cross entropy is optimized twice for each iteration. Let $P(\theta)$ be the Program network. Let $R(\phi)$ be the Read network. 'Info' refers to the information bits mini-batch per network use. $\widetilde{info}'$ is the estimated information bits" mini-batch at the read network output. Variables $\lambda_\phi$, $\lambda_\theta$ represent the learning rates.

---

Initialize parameter vectors $\theta$, $\phi$
for each iteration do
    for each Read network update step do
        fix $P(\theta)$
        $\phi \leftarrow \phi - \lambda_\phi \nabla_\phi \text{CrossEntropy}(info, \widetilde{info})$
    end for
    for each Program network update step do
        fix $R(\phi)$
        $\theta \leftarrow \theta - \lambda_\theta \nabla_\theta \text{CrossEntropy}(info, \widetilde{info})$
    end for
end for

---

Example Training Algorithm

Thus, according to certain embodiments, a loss function may be calculated using the predicted scores and the true voltage levels. An option for the loss function is cross entropy, but there are other options as well. The gradient of the loss is calculated, with respect to all optimizable parameters, in both the program network and the read network. Parameters are updated using the gradient to minimize the loss. The update can be done using any suitable optimization algorithm, such as stochastic gradient descent, Adam, etc. These steps are repeated until there is a convergence. An additional variation of the training is to switch each step between updating the program network and updating the read network.

Note that in the training, a gradient may be calculated. A gradient can be calculated through functions which are differentiable and which we have an explicit mathematical form. The program network and the read network are such functions and can be differentiated using standard libraries such as TensorFlow and PyTorch. If a real memory model is used in the training loop, the present disclosure cannot differentiate through the training loop, due to a lack of a mathematical expression. Therefore, an estimation known as the REINFORCE estimation can be used.

Alternatively, a memory model can be used. The memory model is a generative model which takes as input K voltages, and returns K voltages, representing noise-corrupted voltages. A generative model is any mathematical expression which can be differentiated-through and which has a random component, such as a parametric Gaussian model or a generative adversarial network. The memory model may be used with measurements collected from a physical memory device such that the model mimics the real memory behavior as close as possible. Fitting generative models is a known training procedure. In other words, the memory model may simulate the noise distribution of a real memory device. Once fitted, the model can be used in the training procedure described above, and the model can be differentiated through.

When the memory model option is used, the model may be refit during the optimization process. The refitment is because the memory and behavior can change, depending on the constellation used. Therefore, after multiple steps of updating the program network, new measurements may be collected from the real memory device using the current constellation, refit the memory model using these measurements, and continue the training.

Accordingly, the present disclosure includes the following embodiments.

A method for selecting program voltages for a memory device is described. Embodiments of the method may include mapping a set of information bits to voltage levels of one or more memory cells based on a plurality of embedding parameters, programming the set of information bits into the one or more memory cells based on the mapping, detecting the voltage levels of the one or more memory cells to generate one or more detected voltage levels, and identifying a set of predicted information bits based on the one or more detected voltage levels using a neural network comprising a plurality of network parameters, wherein the network parameters are trained together with the embedding parameters.

An apparatus for selecting program voltages for a memory device is described. The apparatus may include a processor, memory in electronic communication with the processor, and instructions stored in the memory. The instructions may be operable to cause the processor to map a set of information bits to voltage levels of one or more memory cells based on a plurality of embedding parameters, program the set of information bits into the one or more memory cells based on the mapping, detect the voltage levels of the one or more memory cells to generate one or more detected voltage levels, and identify a set of predicted information bits based on the one or more detected voltage levels using a neural network comprising a plurality of network parameters, wherein the network parameters are trained together with the embedding parameters.

A non-transitory computer readable medium storing code for selecting program voltages for a memory device is described. In some examples, the code comprises instructions executable by a processor to: map a set of information bits to voltage levels of one or more memory cells based on a plurality of embedding parameters, program the set of information bits into the one or more memory cells based on the mapping, detect the voltage levels of the one or more memory cells to generate one or more detected voltage levels, and identify a set of predicted information bits based on the one or more detected voltage levels using a neural network comprising a plurality of network parameters, wherein the network parameters are trained together with the embedding parameters.

Some examples of the method, apparatus, non-transitory computer readable medium, and system described above may further include apply a Gray code to the set of information bits, wherein the mapping is based on the Gray code. In some examples, the one or more memory cells comprise a plurality of memory cells, and the plurality of embedding parameters comprises an array having a number of dimensions equal to a number of the memory cells.

Some examples of the method, apparatus, non-transitory computer readable medium, and system described above may further include embedding the set of information bits into an embedding space based on the embedding parameters to produce an embedded symbol. Some examples may further include apply a sigmoid function to constrain the embedded information symbol to produce a constrained symbol. Some examples may further include scaling the constrained symbol to produce a scaled symbol corresponding to a voltage within a valid dynamic range, wherein the set of information bits is mapped based on the scaled symbol.

Some examples of the method, apparatus, non-transitory computer readable medium, and system described above may further include generating a set of information bit probabilities based on the detected voltage levels using the neural network. Some examples may further include selecting a highest information bit probability from the set of information bit probabilities, wherein the set of predicted information bits is identified based on the highest information bit probability.

A method for selecting program voltages for a memory device is described. Embodiments of the method may include initializing a plurality of embedding parameters and a set of network parameters, mapping a set of information bits to voltage levels of one or more memory cells based on the embedding parameters, identifying a set of predicted information bits using an ANN based on the network parameters, and updating the embedding parameters and the network parameters based at least in part on the set of predicted information bits.

An apparatus for selecting program voltages for a memory device is described. The apparatus may include a processor, memory in electronic communication with the processor, and instructions stored in the memory. The instructions may be operable to cause the processor to initialize a plurality of embedding parameters and a set of network parameters, map a set of information bits to voltage levels of one or more memory cells based on the embedding parameters, identify a set of predicted information bits using an ANN based on the network parameters, and update the embedding parameters and the network parameters based at least in part on the set of predicted information bits.

A non-transitory computer readable medium storing code for selecting program voltages for a memory device is described. In some examples, the code comprises instructions executable by a processor to: initialize a plurality of embedding parameters and a set of network parameters, map a set of information bits to voltage levels of one or more memory cells based on the embedding parameters, identify a set of predicted information bits using an ANN based on the network parameters, and update the embedding parameters and the network parameters based at least in part on the set of predicted information bits.

Some examples of the method, apparatus, non-transitory computer readable medium, and system described above may further include updating the network parameters based on the embedding parameters to produce updated network parameters. Some examples may further include updating the embedding parameters based on the updated embedding parameters to produce updated embedding parameters.

Some examples of the method, apparatus, non-transitory computer readable medium, and system described above may further include performing a plurality of training iterations, wherein the embedding parameters and the network parameters are updated during each of the training iterations.

Some examples of the method, apparatus, non-transitory computer readable medium, and system described above may further include computing a gradient of a classification loss function of the set of information bits and the set of predicted information bits, wherein the embedding parameters or the network parameters is updated based on the gradient of the classification loss function.

In some examples, the gradient comprises an approximation of a physical NAND channel. Some examples of the method, apparatus, non-transitory computer readable medium, and system described above may further include identifying a mathematical model of one or more memory cells, wherein the gradient of the classification loss function is computed based on the mathematical model. Some examples of the method, apparatus, non-transitory computer readable medium, and system described above may further include updating the mathematical model based on data from additional memory cells.

Some examples of the method, apparatus, non-transitory computer readable medium, and system described above may further include programming the set of information bits into the one or more memory cells based on the mapping. Some examples may further include detecting the voltage levels of the one or more memory cells to generate one or more detected voltage levels, wherein the set of predicted information bits is identified based on the one or more detected voltage levels.

Some examples of the method, apparatus, non-transitory computer readable medium, and system described above may further include generating a set of information bit probabilities based on the detected voltage levels using the neural network, wherein the set of predicted information bits is identified based on the highest information bit probability. In some examples, the one or more memory cells comprise a plurality of memory cells, and the plurality of embedding parameters comprises an array having a number of dimensions equal to a number of the memory cells.

Some examples of the method, apparatus, non-transitory computer readable medium, and system described above may further include embedding the set of information bits into an embedding space based on the embedding parameters to produce an embedded symbol. Some examples may further include apply a sigmoid function to constrain the embedded information symbol to produce a constrained symbol. Some examples may further include scaling the constrained symbol to produce a scaled symbol, wherein the set of information bits is mapped based on the scaled symbol.

An apparatus for selecting program voltages for a memory device is described. Embodiments of the apparatus may include a plurality of memory cells, a programming component comprising an embedding layer based on a plurality of embedding parameters, and a reading component comprising a neural network based on a plurality of network parameters, wherein the network parameters are trained together with the embedding parameter.

A method of manufacturing an apparatus for selecting program voltages for a memory device is described. The method may include providing a plurality of memory cells, providing a programming component comprising an embedding layer based on a plurality of embedding parameters, and providing a reading component comprising a neural network based on a plurality of network parameters, wherein the network parameters are trained together with the embedding parameter.

A method of using an apparatus for selecting program voltages for a memory device is described. The method may include using a plurality of memory cells, using a programming component comprising an embedding layer based on a plurality of embedding parameters, and using a reading component comprising a neural network based on a plurality of network parameters, wherein the network parameters are trained together with the embedding parameter.

In some examples, the programming component further comprises a sigmoid layer and a scaling layer. In some examples, the neural network comprises a probability-based classifier. In some examples, the plurality of memory cells comprise NAND memory cells.

Thus, the present disclosure may provide for automatic selection of program voltages and may be invoked repeatedly for each new memory device version or generation, yielding a constellation quickly (when compared to manual labor). Embodiments of the present disclosure are based on an optimization process (the training procedure), providing the ability to find constellations more quickly than premade solutions, and better than manual trial-and-error or heuristics. Additionally, Embodiments of the present disclosure use real data collected from a memory device, which provides a constellation suited to a specific problem when compared to conventional programming constellations.

The description and drawings described herein represent example configurations and do not represent all the implementations within the scope of the claims. For example, the operations and steps may be rearranged, combined or otherwise modified. Also, structures and devices may be represented in the form of block diagrams to represent the relationship between components and avoid obscuring the described concepts. Similar components or features may have the same name but may have different reference numbers corresponding to different figures.

Some modifications to the disclosure may be readily apparent to those skilled in the art, and the principles defined herein may be applied to other variations without departing from the scope of the disclosure. Thus, the disclosure is not limited to the examples and designs described herein, but is to be accorded the broadest scope consistent with the principles and novel features disclosed herein.

The described methods may be implemented or performed by devices that include a general-purpose processor, a digital signal processor (DSP), an application specific integrated circuit (ASIC), a field programmable gate array (FPGA) or other programmable logic device, discrete gate or transistor logic, discrete hardware components, or any combination thereof. A general-purpose processor may be a microprocessor, a conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Thus, the functions described herein may be implemented in hardware or software and may be executed by a processor, firmware, or any combination thereof. If implemented in software executed by a processor, the functions may be stored in the form of instructions or code on a computer-readable medium.

Computer-readable media includes both non-transitory computer storage media and communication media including any medium that facilitates transfer of code or data. A non-transitory storage medium may be any available medium that can be accessed by a computer. For example, non-transitory computer-readable media can comprise random access memory (RAM), read-only memory (ROM), electrically erasable programmable read-only memory (EEPROM), compact disk (CD) or other optical disk storage, magnetic disk storage, or any other non-transitory medium for carrying or storing data or code.

Also, connecting components may be properly termed computer-readable media. For example, if code or data is transmitted from a website, server, or other remote source using a coaxial cable, fiber optic cable, twisted pair, digital subscriber line (DSL), or wireless technology such as infrared, radio, or microwave signals, then the coaxial cable, fiber optic cable, twisted pair, DSL, or wireless technology are included in the definition of medium. Combinations of media are also included within the scope of computer-readable media.

In this disclosure and the following claims, the word "or" indicates an inclusive list such that, for example, the list of X, Y, or Z means X or Y or Z or XY or XZ or YZ or XYZ. Also the phrase "based on" is not used to represent a closed set of conditions. For example, a step that is described as "based on condition A" may be based on both condition A and condition B. In other words, the phrase "based on" shall be construed to mean "based at least in part on." Also, the words "a" or "an" indicate "at least one."

What is claimed is:

1. A method for storing data in a memory device, comprising:
    programming a set of information bits into one or more memory cells by mapping the set of information bits to an input symbol corresponding to voltage levels of the one or more memory cells based on a plurality of embedding parameters;
    detecting the voltage levels of the one or more memory cells;
    determining a predicted symbol corresponding to the input symbol based on the detected voltage levels of the one or more memory cells using a neural network comprising a plurality of network parameters that are trained together with the plurality of embedding parameters using a same classification loss function; and
    obtaining the set of information bits from the memory device based on the predicted symbol.

2. The method of claim 1, wherein:
    the one or more memory cells comprise a plurality of memory cells, and the plurality of embedding parameters comprises an array having a number of dimensions equal to a number of the memory cells.

3. The method of claim 1, further comprising:
    embedding the set of information bits into an embedding space based on the embedding parameters to produce an embedded symbol;
    apply a sigmoid function to constrain the embedded symbol to produce a constrained symbol; and
    scaling the constrained symbol to produce a scaled symbol corresponding to a voltage within a valid dynamic range, wherein the set of information bits is mapped based on the scaled symbol.

4. The method of claim 1, further comprising:
    generating a set of information bit probabilities based on the detected voltage levels using the neural network; and selecting a highest information bit probability from the set of information bit probabilities, wherein the set of information bits is obtained based on the highest information bit probability.

\* \* \* \* \*